United States Patent [19]

Arai et al.

[11] Patent Number: 4,492,997
[45] Date of Patent: Jan. 8, 1985

[54] REPRODUCING AND AMPLIFYING CIRCUIT FOR MAGNETORESISTIVE HEAD

[75] Inventors: Takao Arai; Takaharu Noguchi, both of Yokohama, Japan

[73] Assignee: Hitachi, Ltd., Tokyo, Japan

[21] Appl. No.: 324,674

[22] Filed: Nov. 24, 1981

[30] Foreign Application Priority Data

Nov. 28, 1980 [JP] Japan .................. 55-166551
Dec. 10, 1980 [JP] Japan .................. 55-173261

[51] Int. Cl.³ .............................................. G11B 5/00
[52] U.S. Cl. .................................................. 360/113
[58] Field of Search ............... 360/113; 179/110 E; 324/249, 252; 330/62, 143, 256

[56] References Cited

U.S. PATENT DOCUMENTS

| | | | |
|---|---|---|---|
| 3,458,827 | 7/1969 | Taylor et al. | 330/143 |
| 3,493,694 | 2/1970 | Hunt | 360/113 |
| 3,918,091 | 11/1975 | Walraven et al. | 360/77 |
| 3,979,775 | 9/1976 | Schwarz | 360/113 |
| 4,050,083 | 9/1977 | Harr | 360/113 |
| 4,280,158 | 7/1981 | de Niet | 360/113 |

FOREIGN PATENT DOCUMENTS 48-77818 10/1973 Japan .

OTHER PUBLICATIONS

Halbleiter-Schaltungstechnik, 3rd Ed. pp. 142-143 by Tietze & Schenk 1974.

Primary Examiner—George G. Stellar
Attorney, Agent, or Firm—Antonelli, Terry & Wands

[57] ABSTRACT

A reproducing and amplifying circuit for a magnetoresistive head comprises an amplifying circuit with a feedback circuit. The head is part of the feedback circuit. Thus, the head is connectable with the feedback circuit so that the head is supplied with a drive current by the amplifying circuit and a reproduced electric signal outputted by the head is coupled to the amplifying circuit for amplification. A magnetoresistive element may be provided in the amplifying circuit to effect temperature compensation for the head. The reproducing and amplifying circuit is simple in structure, has an enhanced signal-to-noise ratio and is immune to temperature variation.

12 Claims, 19 Drawing Figures

F I G. 9
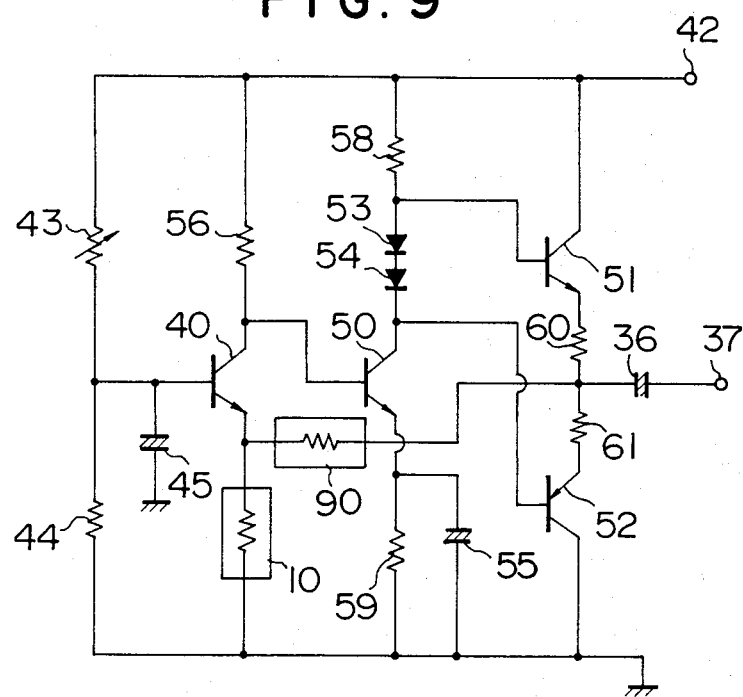
F I G. 10
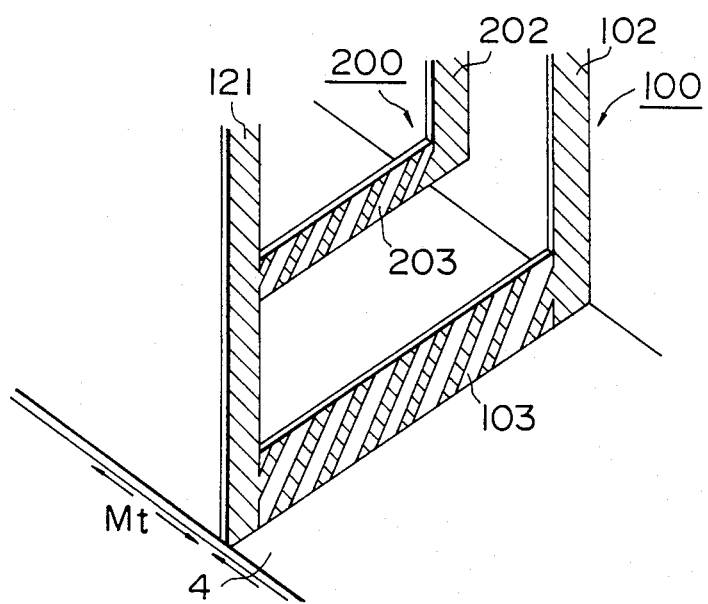

REPRODUCING AND AMPLIFYING CIRCUIT FOR MAGNETORESISTIVE HEAD

The present invention relates to a reproducing and amplifying circuit for a magnetroresistive head.

An electromagnetic induction type head has hitherto been adopted widely as a magnetic head for use in magnetic recording and reproducing apparatus such as tape recorders. However, current progress in thin film technologies has brought a magnetic head utilizing a magnetoresistive element (hereinafter simply referred to as MR element) into use.

This type of magnetic head makes use of changes in resistance of a ferromagnetic thin film such as a permalloy thin film, which changes are caused by a magnetic field, and is often called an MR head. Typically, a reproducing and amplifying circuit for the MR head has a drive current circuit for supplying a constant current to the head, and an amplifier circuit for amplifying a reproduced electric signal derived from the head in the form of a change in resistance of the head. Conventionally, these circuits were provided separately and therefore, the structure of the reproducing and amplifying circuit was complicated, thus raising the cost of manufacture and degrading the signal-to-noise ratio, as will be further explained later.

As a prior art disclosing a reproducing and amplifying circuit for an MR Head, reference may be made to Japanese Patent Application Laid-Open No. 77818/73 (laid open Oct. 19, 1973), for example. This Japanese publication is directed to the subject of a thin film magnetoresistive head but it outlines a reproducing and amplifying circuit for the MR head in connection with FIG. 4.

An object of this invention is to provide a reproducing and amplifying circuit which is simple in structure and improved in the signal-to-noise ratio.

Another object of the invention is to provide a simplified reproducing and amplifying circuit capable of compensating the temperature dependency of the MR head and capable of suffering less noise than prior reproducing and amplifying circuits.

To accomplish the above objects, according to one aspect of the invention, a reproducing and amplifying circuit for an MR head comprises an amplifier circuit with a feedback circuit in which the MR head is connected with the feedback circuit and the circuit arrangement is such that in operation the voltage at the junction of the head and the feedback circuit is held constant, whereby the amplifier circuit serves both to supply a drive current to the MR head and to amplify a reproduced electric signal derived from the head.

According to another aspect of the invention, a reproducing and amplifying circuit for an MR head comprises an amplifier circuit with a negative feedback circuit in which based on the fact that the MR head is equivalent to a resistor, the MR head is connected to serve as a portion of the negative feedback resistor of the amplifier circuit to thereby constitute a current drive and amplifying circuit and the circuit arrangement is such that in operation the voltage at the junction is held constant.

According to still another aspect of the invention subsidiary to the above two aspects, the feedback circuit or the amplifier circuit includes a magnetoresistive element similar to the MR head.

In the accompanying drawings:

FIGS. 7 to 9 are circuit diagrams showing reproducing and amplifying circuits with a temperature compensation element in accordance with various embodiments of the invention;

FIG. 10 is a fragmentary perspective view showing an MR head and temperature compensation MR element structure adapted for the invention;

Figure 11A:
Figure 11B:
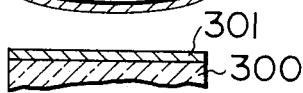
Figure 11C:
Figure 11D:
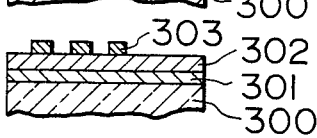
Figure 11E:
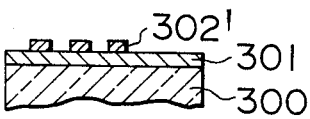
Figure 11F:
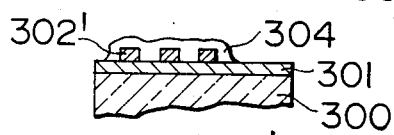
Figure 11G:
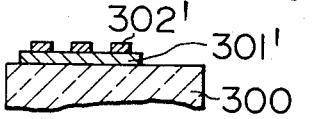
Figure 12:
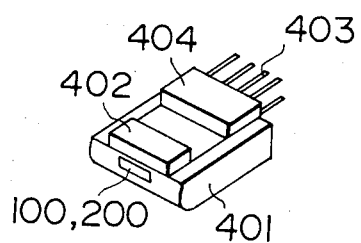
Figure 11H:
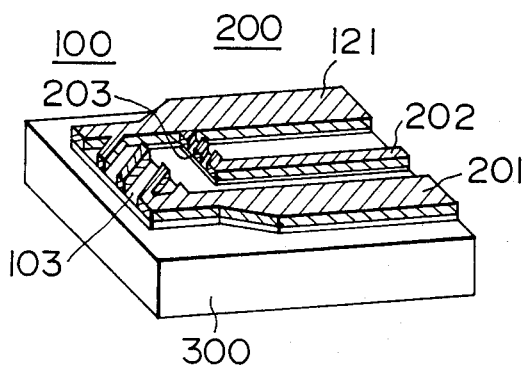

FIGS. 11(a)–11(h) are a diagrammatic representation useful for explaining the fabrication process of the structure shown in FIG. 10; and FIG. 12 is a perspective view showing a finished product of the MR head and MR element structure.

Figure 1:
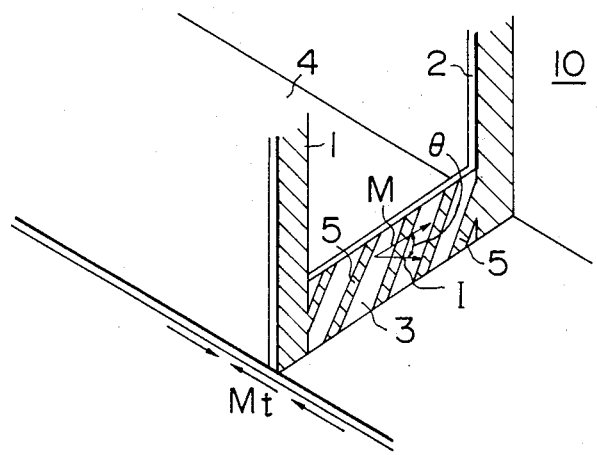
FIG. 1 is a fragmentary perspective view showing an MR head.
Figure 2:
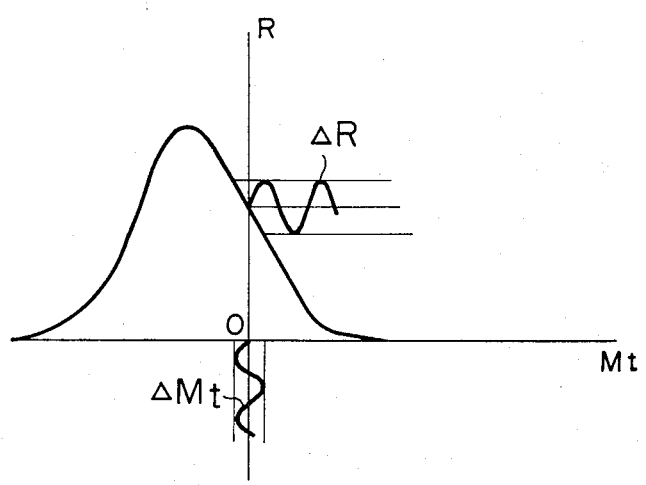
FIG. 2 is a graph useful for explaining the operation of the MR HEAD.

Referring now to FIGS. 1 and 2, one example of an MR head will be described. The MR head utilizing the magnetoresistive effect of the ferromagnetic thin film such as a permalloy thin film has its body formed in a U-shape, for example, as shown in FIG. 1. The MR head, generally designated at 10, includes a pair of metal strips 1 and 2, and a ferromagnetic strip 3 made of a ferromagnetic thin film having its ends fixed to first ends of the respective metal strips 1 and 2. Formed on one surface of the ferromagnetic strip 3 are a plurality of elongated metal paths 5 made of a metallic material which is the same (not necessarily) as that of the metal strips 1 and 2. The metal strips 1 and 2 serve as electrodes for supplying a drive current to the heat 10 and the current flows through the ferromagnetic strip 3 in a direction normal to the longitudinal direction of the elongated metal paths 5. The inclination of the metal path 5 is determined such that in the absence of external magnetic field a current vector I and an axis of easy magnetization M of the ferromagnetic strip make an angle $\theta$ of 45°. In this way, the MR head is set to have a maximum sensitivity.

When a magnetic recording medium 4 engages the MR head and has its magnetization serving as an external signal magnetization vector $M_t$ changing by $\Delta M_t$, the magnetic field of the magnetization vector $M_t$ causes the angle $\theta$ between magnetization vector M and current vector I of the ferromagnetic strip 3 to change with the change $\Delta M_t$ in magnetization vector $M_t$. This creates a change in resistance $\Delta R$ of the ferromagnetic strip 3 as shown in FIG. 2. Accordingly, by detecting the change in resistance $\Delta R$ as a potential difference between metal electrodes 1 and 2, the signal recorded on the recording medium 4 can be read as an electric signal. The angle, $\theta = 45°$, in the absence of external magnetic field determined the operating point in FIG. 2.

Thus, in order to read and reproduce the recorded signal with the MR head, there have been needed a drive current circuit for supplying a constant current to the MR head and an amplifier circuit for detecting and amplifying the change in resistance of the MR head. Conventionally, these circuits have been provided separately as exemplified in FIG. 3.

Figure 3:
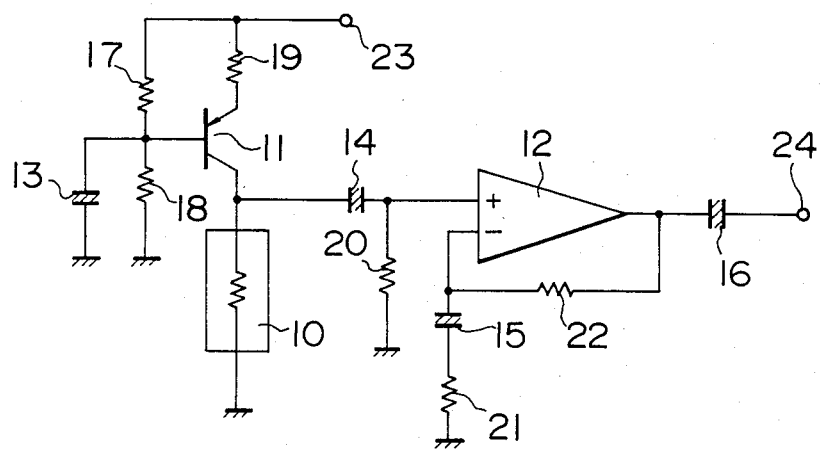
FIG. 3 is a circuit diagram showing a prior art reproducing and amplifying circuit for the MR head.

In FIG. 3, an MR head designated at reference numeral 10 is connected between the collector of a driver transistor 11 and ground. Voltage appearing at a DC power source terminal 23 is divided by resistors 17 and 18 to apply a base bias voltage to the transistor 11. A capacitor 13 is connected in parallel with the resistor 18. A resistor 19 is connected between the power source terminal 23 and the emitter of the transistor 11. Consequently, a drive current as defined by the resistors 17 to 19 and the voltage at the DC power source terminal 23 is supplied to the MR head 10. Denoted by reference numeral 12 is a differential amplifier having a non-inverted input terminal connected via a capacitor 14 to the junction of the collector of transistor 11 and the MR head 10. Connected between the non-inverted input terminal of amplifier 12 and ground is a resistor 20. An inverted input terminal of the amplifier 12 is connected to an output terminal of the amplifier 12 via a resistor 22 and to ground via a series circuit of a capacitor 15 and a resistor 21. The output of the amplifier 12 is supplied to an output signal terminal 24 via a capacitor 16. When a constant drive current is supplied to the MR head 10 and the magnetic recording medium is caused to run being is sliding contact to the head as described hereinbefore, the resistance of the MR head changes in proportion to a change in the external magnetic field (magnetization in the recording medium) applied to the MR head to change the collector voltage of the transistor 11. A change in the collector voltage is amplified and picked up through an amplifier circuit constituted by the differential amplifier 12, capacitors 14 to 16 and resistors 20 to 22 so as to read the signal from the recording medium 4.

In this conventional circuit structure, however, the current drive circuit and the amplifier circuit were provided separately, resulting in a complicated structure and considerably raised costs of manufacture.

Further, since the signal read out by the MR head is in general a very low level signal, it is necessary to suppress noise of the circuitry involved to a sufficiently low level in order to attain a necessary level of the signal-to-noise ratio. However, the above prior art example contains, in addition to the MR head 10 liable to resistance noise and transistors in the differential amplifier circuit 12 liable to transistor noise, a number of noise sources including the resistors 19 and 21 liable to thermal noise and the transistor 11 liable to transistor noise, thus making it difficult to lower noise and attain a sufficient signal-to-noise ratio.

The invention will now be described by way of example with reference to the accompanying drawings.

Figure 4:
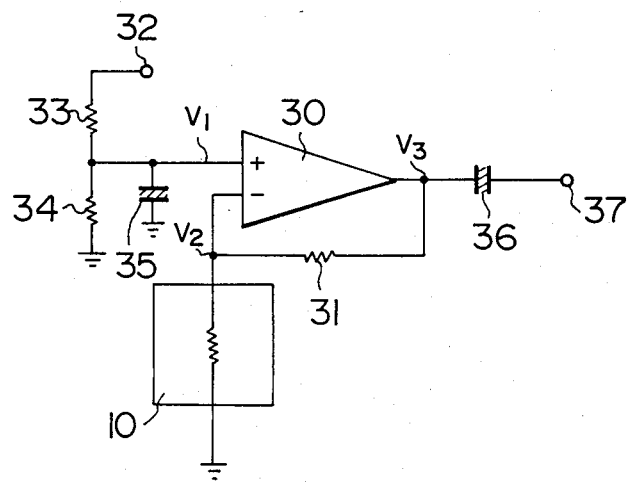
FIGS. 4 to 6 are circuit diagrams showing reproducing and amplifying circuits in accordance with various embodiments of the invention.

Referring now to FIG. 4, there are provided an MR head 10 engageable with a magnetic recording medium for reproducing an electric signal from magnetization in the recording medium, a series circuit of two voltage divider resistors 33 and 34 connected between a DC power source terminal 32 and earth, and a differential amplifier 30 having a non-inverted input terminal connected to the junction of the resistors 33 and 34 for receiving a fixed voltage from the series circuit of the voltage divider resistors. A capacitor 35 is also connected between the junction and ground. A resistor 31 is connected between an inverted input terminal and an output terminal of the amplifier 30 to constitute a negative feedback circuit. The MR head 10 is connected between the junction of the resistor 31 and the inverted input terminal of amplifier 30 in the feedback circuit and ground. The output of the amplifier 30 is supplied to an output signal terminal 37 via a capacitor 36.

Let $v_1$ be the voltage at the junction of the resistors 33 and 34, i.e., at the non-inverted input terminal of amplifier 30, $v_2$ the voltage at the junction of the MR head 10 and the resistor 31, i.e., at the inverted input terminal of amplifier 30, $v_3$ the voltage at the output terminal of amplifier 30, A the gain of the amplifier 30, and $R_h$ and $R_f$ resistances of the MR head and the resistor 31, respectively, and $$(v_1 - v_2)A = v_3 \tag{1}$$

$$\frac{R_h}{R_h + R_f} = \frac{v_2}{v_3} \tag{2}$$

stand. From equations (1) and (2), $$\left(\frac{v_1}{v_2} - 1\right) A = \frac{R_h + R_f}{R_h} \tag{3}$$

is obtained. Accordingly, by determining circuit constants in the circuit of FIG. 4 such that $$A >> \frac{R_h + R_f}{R_h} \tag{4}$$

may stand according to the teaching of the present invention, $$v_1 \simeq v_2 \tag{5}$$

can be held. Namely, the voltage $v_2$ at the junction of the MR head 10 and the resistor 31 becomes nearly equal to the fixed voltage $v_1$ which is supplied from the voltage divider resistors 33 and 34 to the non-inverted input terminal of the amplifier 30. Consequently, when the MR head 10 engages the magnetic recording medium and the resistance of the head 10 is changed under the influence of magnetization in the recording medium, the feedback current changes to always make $v_2$ equal to $v_1$ and a voltage change proportional to a resistance change of the MR head 10 can be obtained across the resistor 31.

In equation (4), "A" represents the gain (the open loop gain) of the amplifying circuitry when the feedback loop including the output terminal of amplifier 30, the resistor 31 and the inverted input terminal of amplifier 30 is open, and $(R_h + R_f)/R_h$ represents the gain (the closed loop gain) of the amplifying circuitry when the feedback loop is closed. The amplifying circuitry herein stands for a circuitry which includes the MR head 10, amplifier 30 and resistor 31 constituting the feedback circuit. From equations (1) and (2), the closed loop gain $v_3/v_1$ is, $$\frac{v_3}{v_1} = \frac{A}{A \cdot R_h/(R_h + R_f) + 1} \tag{6}$$

For $A >> 1$, $$\frac{v_3}{v_1} \simeq \frac{R_h + R_f}{R_h} \tag{7}$$

stands. As will be seen from the above description, the amplifying circuitry in the circuit structure of FIG. 4 has an open loop gain A which is sufficiently larger than a closed loop gain, of course, $A >> 1$. Typically, the MR head 10 has a low impedance of 20 to 30 ohms, for example, because of its material and structure.

The amplifying circuitry as discussed in explaining the gain but removed of the MR head 10 is construed as the essential part of the reproducing and amplifying circuit in this embodiment.

With the above construction, it is possible to materialize a simple circuit structure which can both supply a drive circuit to the MR head 10 and amplify a reproduced electric signal derived from the head 10 and in addition, it is also possible by employing a low noise transistor as the first stage transistor of the differential amplifier 30 to realize a low noise reproducing and amplifying circuit for MR heads with a reduced number of noise sources which are the MR head 10 liable to resistance noise and transistors in the differential amplifier 30 liable to transistor noise.

Figure 5:
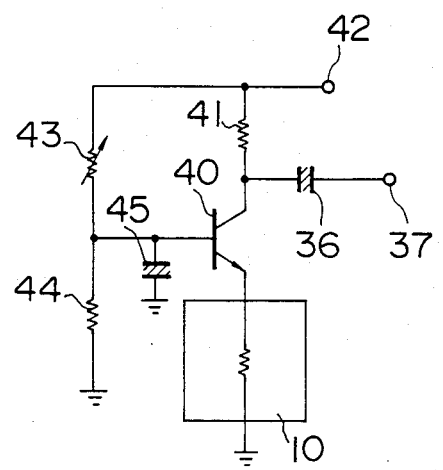

Turning to FIG. 5, there is shown an embodiment of a more simplified low noise reproducing and amplifying circuit for MR heads. In FIG. 5, an MR head 10 is connected between the emitter of an electronic amplifying element constituting an amplifier circuit, that is, of a transistor 40 and ground. The transistor 40 has its base connected to the junction of resistors 43 and 44 constituting a voltage divider. The resistors 43 and 44 are connected in series between a DC power source terminal 42 and ground. In particular, the resistor 43 is a variable resistor adapted to adjust a drive current supplied to the head 10. A capacitor 45 is connected between the junction of the resistors 43 and 44 and ground. Connected between the collector of transistor 40 and the DC power source terminal is a collector load resistor 41. The transistor 40 has its collector connected to a signal output terminal 37 via a capacitor 36. The emitter of transistor 40 and the MR head 10 therefore constitute a current feedback circuit.

In this embodiment, the collector current is passed so as to make voltage at the junction of the MR head 10 and the emitter of transistor 40 have a fixed value which is equal to the base voltage of the transistor 40 determined by the voltage division resistors 43 and 44 minus the base-to-emitter voltage of the transistor 40. Consequently, when the resistance of the MR head 10 changes with a change in the external magnetic field applied to the MR head 10, the collector current changes so as to provide an output signal proportional to the change in the external magnetic field via the capacitor 36. This embodiment has the same number of noise sources as the FIG. 4 embodiment but it is advantageous over the FIG. 4 embodiment in the reduction of transistor noise as using only one transistor in contrast to the FIG. 4 embodiment using the differential amplifier as the amplifying circuit. Conversely, the FIG. 5 embodiment may be slightly inferior from the standpoint of the linearity.

Figure 6:
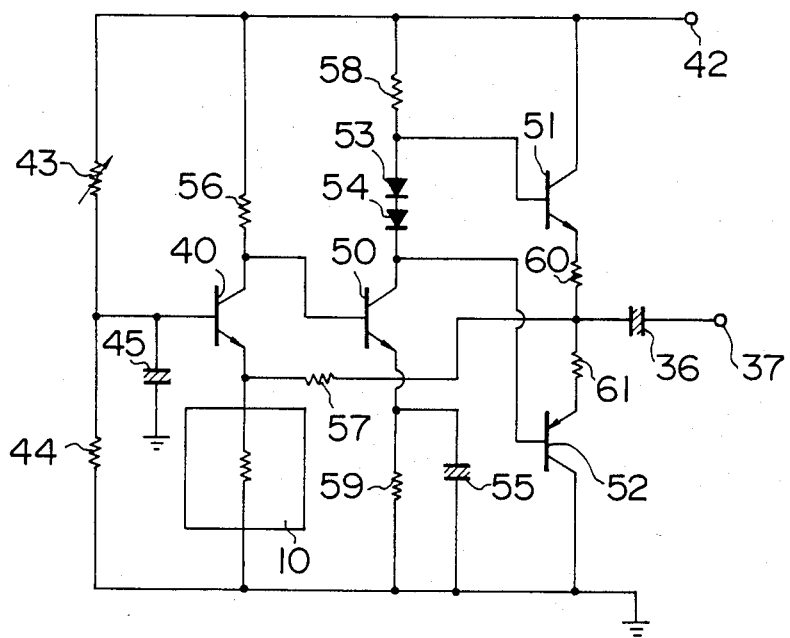

Another embodiment as shown in FIG. 6 provides improved linearity. In FIG. 6, there are provided an MR head 10, capacitors 36, 45 and 55, an output signal terminal 37, transistors 40 and 50 to 52, a variable resistor 43, resistors 44 and 56 to 61, a DC power source terminal 42, and diodes 53 and 54. This embodiment of FIG. 6 is exactly the same as the FIG. 5 embodiment in principle and achieves the same effect together with elimination of the linearity problem inherent to the FIG. 5 embodiment by using a direct coupling three-stage amplifier circuit.

Returning to FIG. 3, temperature dependency of the MR head 10 will now be discussed. Since resistance characteristics of the MR head 10 have dependency upon temperatures, the prior art circuit as exemplified in FIG. 3 is affected by temperature changes to greatly change its output level and signal-to-noise ratio. More particularly, letting current flowing through the MR head 10 be $I_M$, resistance of the MR head 10 be $R_M$, and resistances of the resistors 21 and 22 be $R_{21}$ and $R_{22}$, respectively, output signal $V_4$ is given by equation (8):

$$V_4 = I_M \cdot R_M \cdot (1 + R_{22}/R_{21}) \quad (8)$$

Then, output signal $V_5$ produced when the temperature of the MR head 10 changes in accordance with changes in the ambient temperature is given by equation (9):

$$V_5 = I_M \cdot R_M \cdot f(\Delta T) \cdot (1 + R_{22}/R_{21}) \quad (9).$$

In equation (9), $f(\Delta T)$ is a function of the resistance of the MR head depending upon the temperature change.

It will be appreciated from equations (8) and (9) that in the prior art circuit as exemplified in FIG. 3, the output signal level is caused to change with $f(\Delta T)$.

Figure 7:
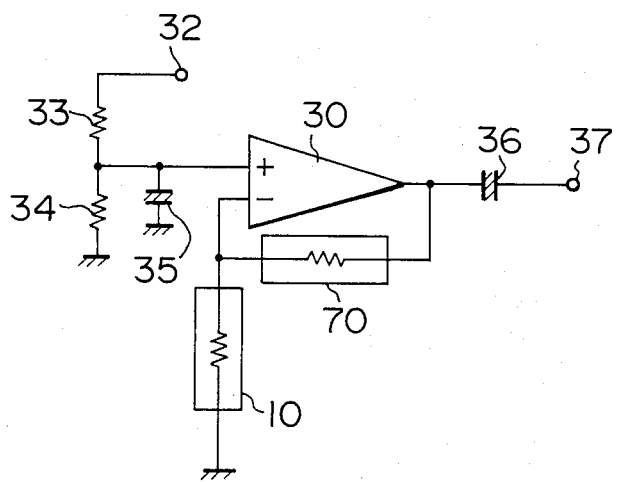
Figure 8:
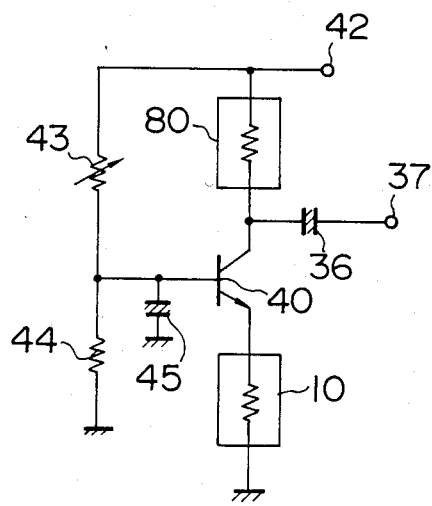

In view of the above, embodiments as shown in FIGS. 7 to 9 not only retains the advantages of a simplified construction and an improved signal-to-noise ratio but also incorporates means for temperature compensation in consideration of the temperature dependency of the MR head 10.

With reference to FIG. 7, there is shown an embodiment which is the same as the FIG. 4 embodiment with only an exception that a magnetoresistive (MR) element 70 is used in place of the resistor 31 in the feedback circuit. The MR element 70 has preferably much the same configuration and the same material as an MR head 10. With this construction, the MR element 70 in the feedback circuit and the MR head 10 have resistances of substantially the same temperature dependency so that the temperature dependency of the MR head 10 can be compensated. More particularly, in accordance with this embodiment, whenever resistance $R_M$ of the MR head 10 changes by $f(\Delta T)$ dependent on changes in ambient temperature, the resistance $R_{MS}$ of the temperature compensation MR element 70 also changes by $f(\Delta T)$ so that the voltage gain of the amplifier circuit can always be rendered constant, thereby materializing a reproducing and amplifying circuit for MR heads which can produce output signals of a fixed amplitude irrespective of changes in the ambient temperature. The reproducing and amplifying operation of this embodiment is the same as that of the FIG. 4 embodiment and is not described herein.

Accordingly, in the embodiment of FIG. 7, a differential amplifier 30 supplies a drive current to the MR head 10 and a separate drive current circuit is dispensed with to simplify the circuit construction. Also, since noise generation in the FIG. 7 embodiment is only due to the MR head 10 liable to resistance noise and transistors in the differential amplifier 30 liable to transistor noise, it is possible by employing a low noise transistor as the first stage transistor of the differential amplifier 30 to readily lower noise for obtaining a high signal-to-noise ratio. In addition, it is also possible to readily attain the temperature compensation.

Referring to FIG. 8, a further embodiment is shown which comprises a transistor in a grounded base configuration adapted to supply a drive current and amplify signals and which is the same as the FIG. 5 embodiment with only an exception that an MR element 80 substitutes for the resistor 41. More particularly, the MR element 80 acts as a collector load resistor of a transistor 40. The MR element 80 has preferably much the same configuration and the same material as the MR head 10. This ensures that the MR head 10 in the current feedback circuit and the MR element 80 acting as the collector load resistor can have resistances of substantially the same temperature dependency and compensation for the temperature dependency of the MR head 10 can be effected as in the FIG. 7 embodiment.

Specifically, in this embodiment, an amplifier circuit is constituted by the transistor 40 having its base and emitter serving as two inputs, of which one, i.e., the base input is maintained at a substantially fixed potential and hence adapted for supply of the drive current to the MR head 10 as well as amplification of signals, thus making it possible to simplify the circuit construction and reduce the number of noise sources for lowering noise as in the FIG. 4 embodiment. In addition, the MR element 80 is used as the collector load resistor of the transistor 40 to cancel out changes in resistance of the MR head 10 due to changes in temperature for effecting the temperature compensation, thereby providing a stable amplifier circuit whose output level can remain unchanged even when the temperature changes. Accordingly, this embodiment can simplify the circuit construction remarkably and can afford to provide the reproducing and amplifying circuit for MR heads at low cost.

Referring to FIG. 9, there is shown a further embodiment which adds to the FIG. 8 embodiment a DC amplifier stage for improving the linearity and which is the same as the FIG. 6 embodiment with only an exception that an MR element 90 substitutes for the resistor 57.

A circuit as shown in FIG. 9 comprises transistors 50 to 52, level shift diodes 53 and 54, a capacitor 55, and resistors 56, 78 to 61. The collector of the transistor 40 is connected to the resistor 56, and a signal appearing at the collector of transistor 40 is amplified by a DC amplifier comprised of the transistors 50 to 52 and supplied to an output terminal 37 as an output signal. The output of the DC amplifier is fed back to the emitter of transistor 40 via the MR element 90 to effect temperature compensation for the MR head 10. As in the embodiments of FIGS. 7 and 8, it is preferable that the MR element 90 also has much the same configuration and the same material as the MR head in this embodiment.

Thus, this embodiment can afford to provide a reproducing and amplifying circuit for MR heads which has a linearity superior to that of the FIG. 8 embodiment.

Since, in the embodiments of FIGS. 7 to 9, the temperature compensation for the MR head is based on the fact that the MR head is substantially equivalent to a pure resistance circuit and that the MR element having the same temperature characteristics as the MR head can be prepared very readily through thin film technologies, these embodiments can readily provide very excellent temperature compensation and can afford to provide a reproducing and amplifying circuit for MR heads which operates stably and is immune to changes in characteristics.

As described above, in the embodiments of FIGS. 7 to 9, a common circuit is adapted for supplying a drive current to the MR head and amplifying signals of the MR head, thereby providing a simplified reproducing and amplifying circuit for MR heads which can lower noise and effect complete temperature compensation for the MR. head.

In order to effect correct temperaure compensation for the MR head 10, it is necessary to match characteristics of the MR element and the MR head 10 and it is also necessary to make substantially equal temperatures of the MR element and MR head.

FIG. 10 illustrates one example of a structure including an MR head and an MR element which may be applied to the embodiments of FIGS. 7 and 9. The MR head and the temperature compensation MR element are generally designated by reference numerals 100 and 200, respectively. The MR head 100 has a ferromagnetic strip 103 and metal strips 102 and 121. Each of the metal strips 102 and 121 has one end fixed to each end of the ferromagnetic strip 103 to be formed in a U-shape as a whole, like the head 10 shown in FIG. 1. On the other hand, the MR element takes the same U-shape form as the MR head 100, having a ferromagnetic strip 203, a metal strip 202 and the metal strip 121. Thus, the ferromagnetic strip 203 has one end connected to one end of the metal strip 202 and the other end connected to an intermediate portion or an extension of the metal strip 121. In other words, the metal strip 121 serves both as one electrode of the MR head and as one electrode of the MR element. The metal strip 102 constitutes the other electrode of the MR head 100 and the metal strip 202 constitutes the other electrode of the MR element 200. As in the MR head 10 shown in FIG. 1, there are formed on one surface of each of the ferromagnetic strips 103 and 203 a plurality of elongated metal paths made of a metallic material which is the same (not necessarily) as that of the metal strips 102 and 202.

While the MR head 100 is adapted for engagement with the magnetic recording medium and reproduction of electric signals, the MR element 200 is intended for temperature compensation for the MR head 100 and is therefore required to be disposed at a location at which the MR element is substantially freed from the influence of magnetization in the magnetic recording medium 4 and confined in substantially the same temperature environment as the MR head 100. Accordingly, as shown in FIG. 10, the MR element 200 for temperature compensation is disposed near the MR head 100 so that they are subjected to substantially the same ambient temperature. Thus, when the ambient temperature changes by $\Delta T$, temperature of the magnetization signal detecting MR head 100 and the temperature compensation MR element 200 change in the same manner and their resistances change by $f(\Delta T)$ in accordance with the same temperature characteristic. The structure of FIG. 10 may be applied to the FIG. 7 embodiment in such a manner that the common metal electrode 121 is connected to one input terminal of the differential amplifier 30 constituting the feedback circuit, the metal electrode 102 is grounded and the metal electrode 202 is connected to the output terminal of the differential amplifier 30, so as to provide the reproducing and amplifying circuit for MR heads which can produce the output that is independent of changes in ambient temperature. The structure may also be applied to the FIG. 9 embodiment in such a manner that the common electrode 121 is connected to the emitter of the transistor 40, the electrode 102 is grounded and the electrode 202 is connected to the junction of the capacitor 36 and the resistors 60 and 61, thereby achieving the same effect. While the embodiments of FIGS. 7 and 9 are for one channel, the invention may of course be applicable to a multichannel system.

FIGS. 11(a)–11(h) illustrate the outline of one example of the fabrication process of the structure shown in FIG. 10. The fabrication process has no direct relevancy to the subject of the present invention and will be described only briefly. All the steps can be carried out using thin film techniques well known in the art.

In FIG. 11(a), a two-inch diameter soda glass wafer substrate 300 is first prepared and its surface is cleaned (step (a)). Permalloy is then vapor deposited on the surface of the substrate 300 to a thickness of 0.1 μm to form a permalloy film 301 (step (b)). Gold is vapor deposited on the permalloy film 301 and on the substrate 300 to a thickness of 0.2 μm to form a conductive film 302 (step (c)). A photoresist film 303 for the formation of desired electrode pattern and metallic path pattern of the MR head and the MR element is formed on the conductive film 302 (step (d)). The conductive film 302 is etched to form the electrode and metallic path patterns 302' (step (e)). Thereafter, for patterning the permalloy film, another photoresist film 304 is formed on the film 301 and the patterns 302' (step (f)) and the film 301 is etched to form ferromagnetic strips 301' of the MR head and the MR element (step (g)). FIG. 11(b) illustrates a perspective view of a similar structure to FIG. 10 prepared through the above-mentioned steps (a) to (g) and carried on the substrate 300.

FIG. 12 is a sketch of a finished product of the MR head/MR element. The structure of FIG. 11(b) is sandwiched by a support plate 401 and a protective film 402, and a sliding surface (for engagement with the magnetic recording medium) of the MR head 100 is polished by lapping. Terminals 403 including lead terminals for electrodes 201, 202 and 121 are provided and reinforced by a fixing plate 404.

We claim:

1. A reproducing and amplifying circuit for a magnetoresistive head engageable with a magnetic recording medium for reproducing an electric signal from magnetization in said recording medium, comprising circuit means for amplifying said reproduced electric signal derived from said head, said amplifying circuit means including an amplifier circuit and a feedback circuit for said amplifier circuit, in which said feedback circuit is provided with means for electrical connection with said head so that said head constitutes a part of said feedback circuit thereby for supplying a drive current to said head and coupling said reproduced electric signal to said amplifying circuit means for its amplification, and said amplifying circuit means has such a circuit structure that in operation the voltage at the junction of said head and said feedback circuit is held constant in which said amplifier circuit includes a differential amplifier having a non-inverted input terminal for receiving a fixed potential and an inverted input terminal for electrical connection with said head by said electrical connection means in said feedback circuit.

2. A reproducing and amplifying circuit comprising a magnetoresistive head engageable with a magnetic recording medium for reproducing an electric signal from magnetization in said recording medium and circuit means for amplifying said reproduced electric signal derived from said head, said amplifying circuit means including an amplifier circuit and a feedback circuit for said amplifier circuit, in which said head is connected with said feedback circuit so as to be a part of said feedback circuit thereby for supplying a drive current to said head and coupling said reproduced electric signal to said amplifying circuit means for its amplification, and said amplifying circuit means includes a constant voltage supply circuit and has such a circuit structure that in operation the voltage at the junction of said head and said feedback circuit is held constant in which said constant voltage circuit has a bleeder circuit for delivering a fixed potential, and said amplifier circuit further includes a differential amplifier having a non-inverted input terminal for receiving said fixed potential and an inverted input terminal in electrical connection with said head in said feedback circuit.

3. A reproducing and amplifying circuit comprising a magnetoresistive head engageable with a magnetic recording medium for reproducing an electric signal from magnetization in said recording medium and circuit means for amplifying said reproduced electric signal derived from said head, said amplifying circuit means including an amplifier circuit and a feedback circuit for said amplifier circuit, in which said head is connected with said feedback circuit so as to be a part of said feedback circuit thereby for supplying a drive current to said head and coupling said reproduced electric signal to said amplifying circuit means for its amplification, and said amplifying circuit means includes a constant voltage supply circuit and has such a circuit structure that in operation the voltage at the junction of said head and said feedback circuit is held constant in which said feedback circuit includes a magnetoresistive element for temperature compensation for said head.

4. A reproducing and amplifying circuit according to claim 3, in which each of said magnetoresistive head and said magnetoresistive element includes a pair of metal strips and a ferromagnetic strip having its ends fixed to first ends of said metal strips to be formed in a U-shape as a whole, said drive current flowing from second end of one of said pair of metal strips through said ferromagnetic strip to second end of the other metal strip.

5. A reproducing and amplifying circuit according to claim 3, wherein said magnetoresistive element is made of the same material as that of said magnetoresistive head.

6. A reproducing and amplifying circuit according to claim 3, in which said constant voltage circuit has a bleeder circuit for delivering a fixed potential, and said amplifier circuit further includes a differential amplifier having a non-inverted input terminal for receiving said fixed potential and an inverted input terminal in electrical connection with said head in said feedback circuit.

7. A reproducing and amplifying circuit according to claim 2, 3 or 6, in which said head has its one end grounded and its other end connected with the inverted input terminal of said differential amplifier.

8. A reproducing and amplifying circuit comprising a magnetoresistive head engageable with a magnetic recording medium for reproducing an electric signal from magnetization in said recording medium and circuit means for amplifying said reproduced electric signal derived from said head, said amplifying circuit means including an amplifier circuit and a feedback circuit for said amplifier circuit, in which said head is connected with said feedback circuit thereby for supplying a drive current to said head and coupling said reproduced electric signal to said amplifying circuit means for its amplification, and said amplifying circuit means has such a circuit structure that in operation the voltage at the junction of said head and said feedback circuit is held constant in which said feedback circuit includes a magnetoresistive element for temperature compensation for said head, in which each of said magnetoresistive head and said magnetoresistive element includes a pair of metal strips and a ferromagnetic strip having its ends fixed to first ends of said metal strips to be formed in a U-shape as a whole, said drive current flowing from second end of one of said pair of metal strips through said ferromagnetic strip to second end of the other metal strip in which one of said pair of metal strips of said magnetoresistive element is constituted by an extension of one of said pair of metal strips of said magnetoresistive head.

9. A reproducing and amplifying circuit comprising a magnetoresistive head engageable with a magnetic recording medium for reproducing an electric signal from magnetization in said recording medium and circuit means for amplifying said reproduced electric signal derived from said head, said amplifying circuit means including an amplifier circuit and a feedback circuit for said amplifier circuit, in which said head is connected with said feedback circuit thereby for supplying a drive current to said head and coupling said reproduced electric signal to said amplifying circuit means for its amplification, and said amplifying circuit means has such a circuit structure that in operation the voltage at the junction of said head and said feedback circuit is held constant in which said amplifier circuit includes an electronic amplifying element having a control electrode for receiving a fixed potential, an electron collecting electrode and an electron emitting electrode in electrical connection with said head in said feedback circuit in which a magnetoresistive element is connected with said collecting electrode of said amplifying element so that said magnetoresistive element serves both as a load resistor of said amplifying element and as a temperature compensation element for said head.

10. A reproducing and amplifying circuit according to claim 9, in which said head has its one end grounded and said electronic amplifying element has its electron emitting electrode in electrical connection with the other end of said head in said feedback circuit.

11. A reproducing and amplifying circuit according to claim 9, in which each of said magnetoresistive head and said magnetoresistive element includes a pair of metal strips and a ferromagnetic strip having its ends fixed to first ends of said metal strips to be formed in a U-shape, said drive current flowing from second end of one of said pair of metal strips through said ferromagnetic strip to second end of the other metal strip.

12. A reproducing and amplifying circuit comprising a magnetoresistive head engageable with a magnetic recording medium for reproducing an electric signal from magnetization in said recording medium and circuit means for amplifying said reproduced electric signal derived from said head, said amplifying circuit means including an amplifier circuit and a feedback circuit for said amplifier circuit, in which said head is connected with said feedback circuit thereby for supplying a drive current to said head and coupling said reproduced electric signal to said amplifying circuit means for its amplification, and said amplifying circuit means has such a circuit structure that in operation the voltage at the junction of said head and said feedback circuit is held constant in which said amplifier circuit includes a differential amplifier having a non-inverted input terminal for receiving a fixed potential and an inverted input terminal in electrical connection with said head in said feedback circuit in which said feedback circuit includes a magnetoresistive element for temperature compensation for said head in which each of said magnetoresistive head and said magnetoresistive element includes a pair of metal strips and a ferromagnetic strip having its ends fixed to first ends of said metal strips to be formed in a U-shape as a whole, said drive current flowing from second end of one of said pair of metal strips through said ferromagnetic strip to second end of the other metal strip in which one of said pair of metal strips of said magnetoresistive element is constituted by an extension of one of said pair of metal strips of said magnetoresistive head.

* * * * *